(12) United States Patent
Wang

(10) Patent No.: US 7,605,407 B2
(45) Date of Patent: Oct. 20, 2009

(54) COMPOSITE STRESSORS WITH VARIABLE ELEMENT ATOMIC CONCENTRATIONS IN MOS DEVICES

(75) Inventor: Yin-Ping Wang, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 12 days.

(21) Appl. No.: 11/516,265

(22) Filed: Sep. 6, 2006

(65) Prior Publication Data

US 2008/0054347 A1    Mar. 6, 2008

(51) Int. Cl.
*H01L 29/94* (2006.01)
(52) U.S. Cl. .................. 257/191; 257/190; 257/192; 257/E21.431; 438/300; 438/301; 438/303; 438/549
(58) Field of Classification Search ................ 257/213, 257/288, 327, 192; 438/197, 300, 301, 303, 438/526–529, 545, 546, 548, 549, 918
See application file for complete search history.

(56) References Cited

U.S. PATENT DOCUMENTS

| | | | | |
|---|---|---|---|---|
| 6,165,858 | A * | 12/2000 | Gardner et al. | 438/305 |
| 2005/0205896 | A1 * | 9/2005 | Li et al. | 257/213 |
| 2005/0287752 | A1 * | 12/2005 | Nouri et al. | 438/303 |
| 2006/0166414 | A1 * | 7/2006 | Carlson et al. | 438/149 |
| 2006/0189053 | A1 * | 8/2006 | Wang et al. | 438/197 |
| 2007/0057287 | A1 * | 3/2007 | Lin et al. | 257/190 |
| 2007/0096149 | A1 * | 5/2007 | Liu et al. | 257/192 |
| 2007/0184600 | A1 * | 8/2007 | Zhang et al. | 438/199 |
| 2007/0235763 | A1 * | 10/2007 | Doyle et al. | 257/202 |

* cited by examiner

*Primary Examiner*—Lynne A. Gurley
*Assistant Examiner*—Vernon P Webb
(74) *Attorney, Agent, or Firm*—Slater & Matsil, L.L.P.

(57) ABSTRACT

A semiconductor device includes a semiconductor substrate, a gate stack on the semiconductor substrate, and a stressor adjacent the gate stack and having at least a portion in the semiconductor substrate, wherein the stressor comprises an element for adjusting a lattice constant of the stressor. The stressor includes a lower portion and a higher portion on the lower portion, wherein the element in the lower portion has a first atomic percentage, and the element in the higher portion has a second atomic percentage substantially greater than the first atomic percentage.

20 Claims, 6 Drawing Sheets

US 7,605,407 B2

COMPOSITE STRESSORS WITH VARIABLE ELEMENT ATOMIC CONCENTRATIONS IN MOS DEVICES

TECHNICAL FIELD

This invention relates generally to integrated circuits, and more particularly to structure and formation methods of MOS devices with stressors.

BACKGROUND

Reductions in the size and inherent features of semiconductor devices (e.g., a metal-oxide semiconductor field-effect transistor) have enabled continued improvement in speed, performance, density, and cost per unit function of integrated circuits over the past few decades. In accordance with a design of the transistor and one of the inherent characteristics thereof, modulating the length of a channel region underlying a gate between a source and drain of the transistor alters a resistance associated with the channel region, thereby affecting the performance of the transistor. More specifically, shortening the length of the channel region reduces a source-to-drain resistance of the transistor, which, assuming other parameters are maintained relatively constant, may allow an increase in current flow between the source and drain when a sufficient voltage is applied to the gate of the transistor.

To further enhance the performance of MOS devices, stress may be introduced in the channel region of a MOS transistor to improve carrier mobility. Generally, it is desirable to induce a tensile stress in the channel region of an n-type metal-oxide-semiconductor ("NMOS") device in a source-to-drain direction and to induce a compressive stress in the channel region of a p-type MOS ("PMOS") device in a source-to-drain direction.

A commonly used method for applying compressive stress to the channel regions of PMOS devices is to grow SiGe stressors in the source and drain regions. Such a method typically includes the steps of forming a gate stack on a semiconductor substrate, forming spacers on sidewalls of the gate stack, forming recesses in the silicon substrate along the gate spacers, epitaxially growing SiGe stressors in the recesses, and then annealing. Since SiGe has a greater lattice constant than silicon has, it expands after annealing and applies a compressive stress to the channel region, which is located between a source SiGe stressor and a drain SiGe stressor. Similarly, stresses can be introduced to the channel regions of NMOS devices by forming SiC stressors. Since SiC has a smaller lattice constant than silicon has, it contracts after annealing and applies a tensile stress to the channel region.

The MOS devices formed from conventional stressor formation processes suffer leakage problems, however. To apply a greater stress to the channel region, the stressors need to have high germanium or carbon concentrations. High germanium or carbon concentrations in turn cause high defect concentrations, and thus cause an increase in junction leakage and a decrease in breakdown voltage. Accordingly, new methods for improving the stressor formation processes are needed.

SUMMARY OF THE INVENTION

In accordance with one aspect of the present invention, a semiconductor device includes a semiconductor substrate, a gate stack on the semiconductor substrate, and a stressor adjacent the gate stack and having at least a portion in the semiconductor substrate, wherein the stressor comprises an element for adjusting a lattice constant of the stressor. The stressor includes a lower portion and a higher portion on the lower portion, wherein the element in the lower portion has a first atomic percentage, and the element in the higher portion has a second atomic percentage substantially greater than the first atomic percentage.

In accordance with another aspect of the present invention, a semiconductor device includes a semiconductor substrate comprising silicon, a gate stack on the semiconductor substrate, a stressor region adjacent the gate stack and having at least a portion in the semiconductor substrate, wherein the stressor region comprises silicon and an element selected from the group consisting essentially of germanium and carbon, and wherein the element in the stressor has a first atomic percentage, and an intermediate region between the semiconductor substrate and the stressor region. The intermediate region comprises silicon and the element. The element in the intermediate region has a second atomic percentage lower than the first atomic percentage.

In accordance with yet another aspect of the present invention, a method for forming a semiconductor device includes providing a semiconductor substrate, forming a gate stack on the semiconductor substrate, forming a gate spacer on a sidewall of the gate stack, forming a recess in the semiconductor substrate adjacent to the gate spacer, and forming a stressor having at least a portion in the recess, wherein the stressor comprises an element for adjusting a lattice constant of the stressor. The step of forming the stressor includes forming a lower portion in the recess, wherein the element in the lower portion has a first atomic percentage, and forming a higher portion on the lower portion, wherein the element in the higher portion has a second atomic percentage substantially greater than the first atomic percentage.

In accordance with yet another aspect of the present invention, a method for forming a semiconductor device includes providing a semiconductor substrate, forming a gate stack on the semiconductor substrate, forming a dummy spacer on a sidewall of the gate stack, forming a recess in the semiconductor substrate substantially aligned with an outer edge of the dummy spacer, and forming a stressor having at least a portion in the recess, wherein the stressor comprises an element selected from the group consisting essentially of germanium and carbon. The step of forming the stressor includes forming a lower portion in the recess, wherein the element in the lower portion has a first atomic percentage, and forming a higher portion on the lower portion, wherein the element in the higher portion has a second atomic percentage substantially greater than the first atomic percentage. The method further includes removing the dummy spacer, forming a gate spacer on the sidewall of the gate stack, and doping an impurity to form a deep source/drain region.

By forming low-dopant regions between stressors and the substrate, the leakage current is reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming stressors in metal-oxide-semiconductor (MOS) devices is provided. The intermediate stages of manufacturing a preferred embodiment of the present invention are illustrated in FIGS. 1 through 9. Variations of the preferred embodiments are then discussed. Throughout the various views and illustrative embodiments of the present invention, like reference numbers are used to designate like elements.

Figure 1:
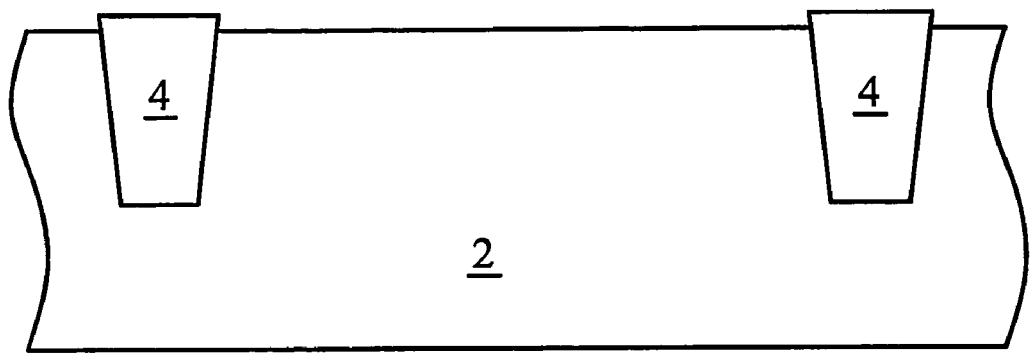
FIGS. 1 through 9 are cross-sectional views of intermediate stages in the manufacture of a PMOS embodiment.

FIG. 1 illustrates the formation of shallow trench isolation (STI) regions in a substrate 2. Preferably, the substrate 2 comprises bulk silicon. Substrate 2 may also have a composite structure, such as silicon-on-insulator (SOI). Shallow trench isolation (STI) regions 4 are formed to isolate device regions. As is known in the art, STI regions 4 may be formed by etching substrate 2 to form recesses, and then filling the recesses with dielectric materials.

Figure 2:
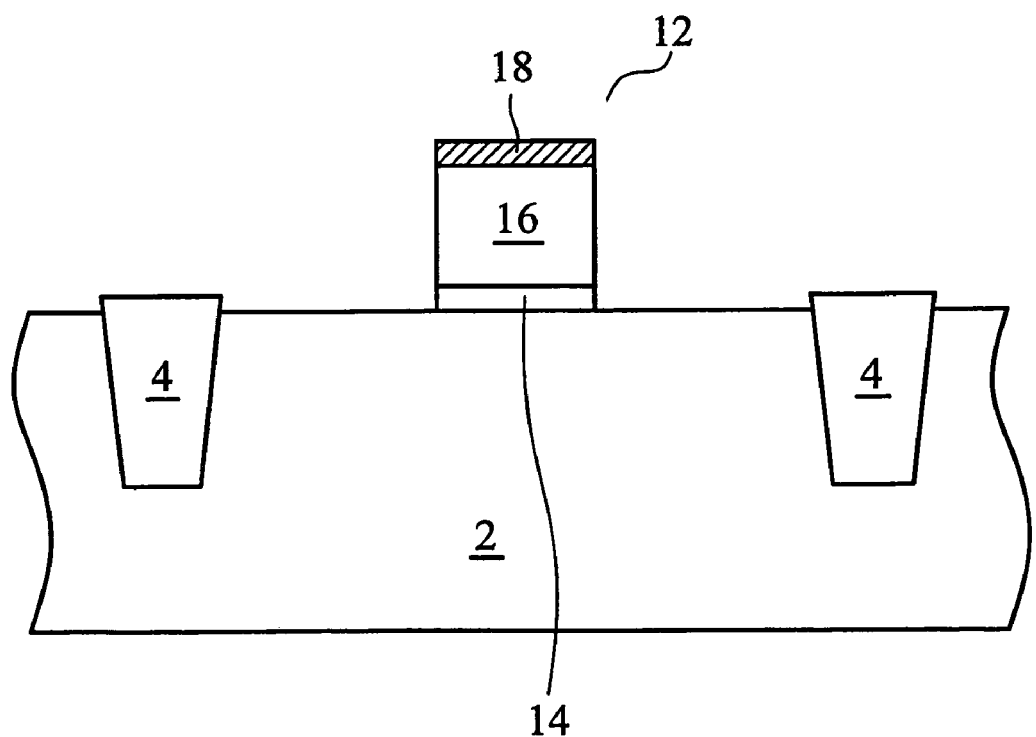

A gate stack 12 comprising a gate dielectric 14, a gate electrode 16 and a hard mask 18 is formed on substrate 2, as is illustrated in FIG. 2. Gate dielectric 14 may be formed of commonly used dielectric materials such as oxides, nitrides, oxynitrides, multi-layers thereof, and combinations thereof. Gate electrode 16 may include commonly used materials such as doped polysilicon, metals, metal silicides, metal nitrides, and combinations thereof. Hard mask 18 preferably comprises silicon nitride, although other materials such as oxides, oxynitrides, and silicon carbide can also be used. Gate dielectric 14, gate electrode 16 and hard mask 18 are preferably formed by depositing stacked layers including a gate dielectric layer, a gate electrode layer and a hard mask layer, and then patterning the stacked layers.

Figure 3:
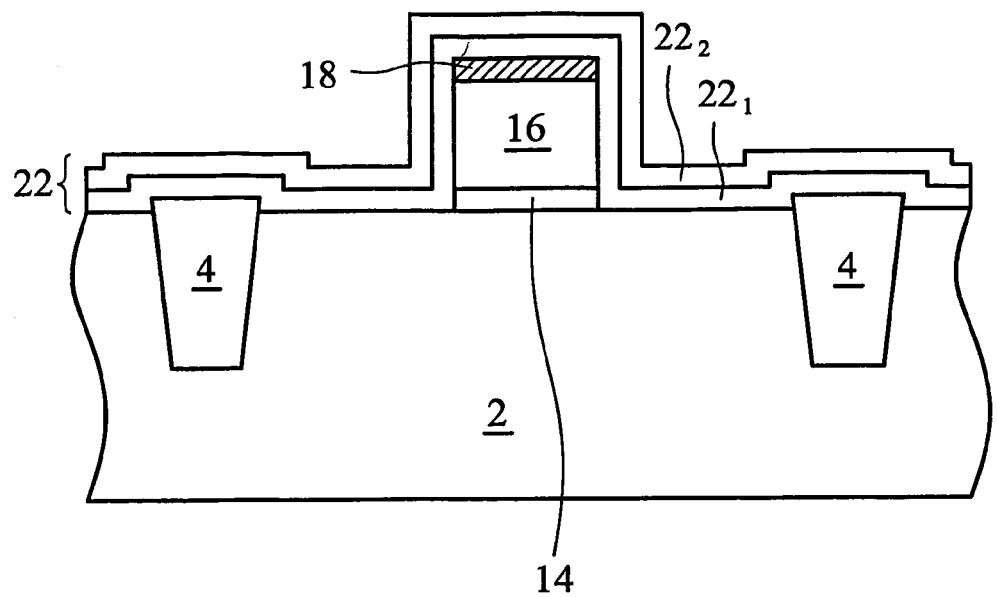

Referring to FIG. 3, a dummy spacer layer 22 is formed. In the preferred embodiment, the dummy spacer layer 22 includes a liner oxide layer $22_1$ and a nitride layer $22_2$. In alternative embodiments, the dummy spacer layer 22 may include one or more layers, each comprising oxide, silicon nitride, silicon oxynitride (SiON) and/or other dielectric materials. The preferred formation methods include commonly used techniques, such as plasma enhanced chemical vapor deposition (PECVD), low-pressure chemical vapor deposition (LPCVD), subatmospheric chemical vapor deposition (SACVD), and the like.

Figure 4:
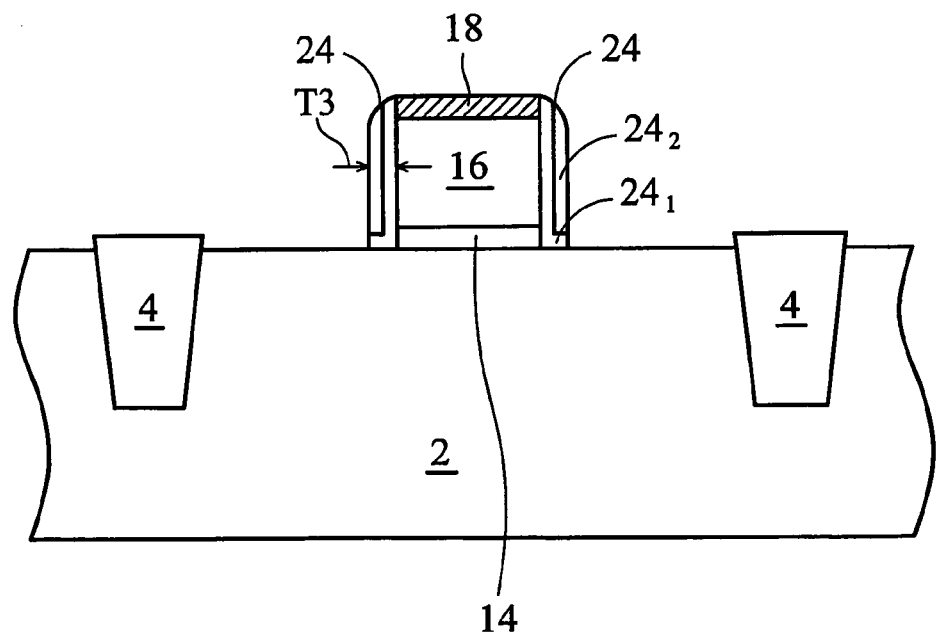

FIG. 4 illustrates the patterning of the dummy spacer layer 22 to form dummy spacers 24, wherein the patterning may be performed by either wet etching or dry etching. The remaining portions of the liner oxide layer $22_1$ and the nitride layer $22_2$ form liner oxide portions $24_1$ and nitride portions $24_2$, respectively.

Figure 5:
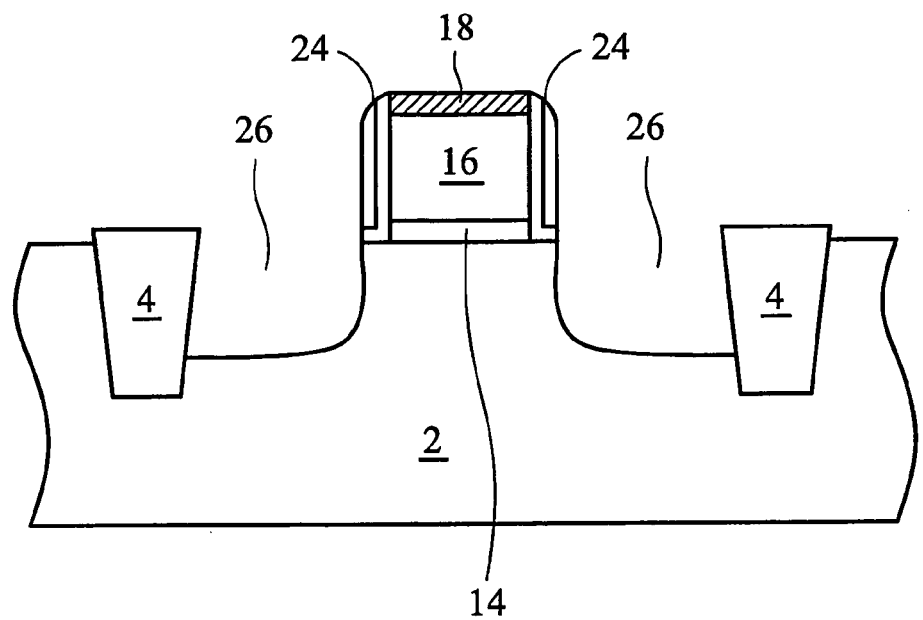

Referring to FIG. 5, recesses 26 are formed along the edges of dummy spacers 24, preferably by isotropically or anisotropically etching substrate 2. The preferred depth of the recesses 26 is between about 500 Å and about 1000 Å, and more preferably between about 700 Å and about 900 Å, although the preferred depth will be scaled according to the scaling of the technology used for forming the integrated circuit.

Figure 6:
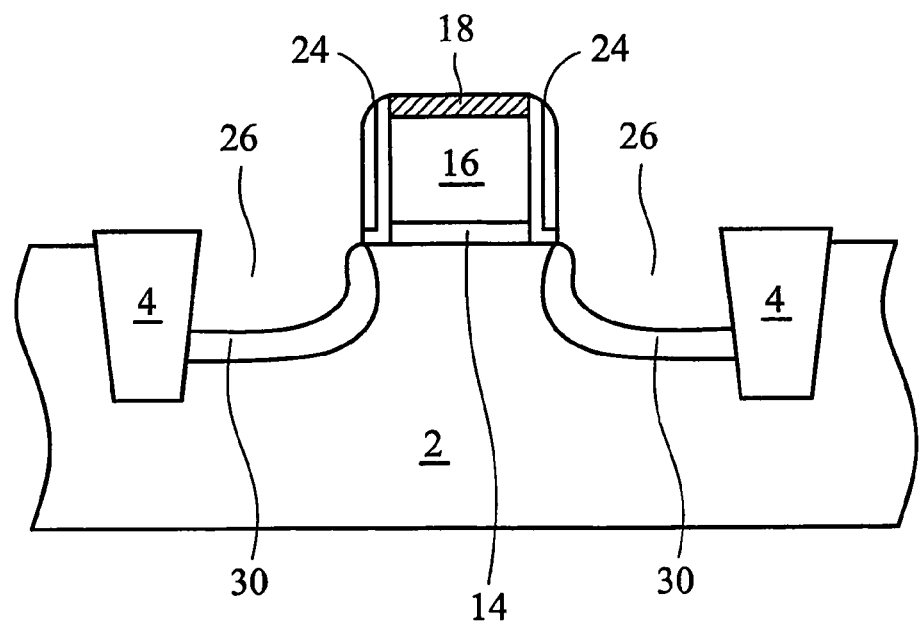

FIG. 6 illustrates the formation of epitaxy regions 30, often referred to as SiGe stressors or regions, preferably by selective epitaxial growth (SEG) in recesses 26. SiGe regions 30 preferably have greater lattice spacing than does substrate 2. In an exemplary embodiment, the SiGe epitaxy is performed using PECVD in a chamber in which precursors containing Si and Ge, such as $SiH_4$ and $GeH_4$, are introduced. The chamber pressure is preferably between about 10 torr and about 200 torr, and more preferably between about 20 torr and about 60 torr. The preferred substrate temperature is between about 400° C. and about 1000° C., and more preferably between about 500° C. and about 800° C. In the preferred embodiment, the resulting SiGe regions 30 include between about 10 atomic percent and about 25 atomic percent germanium, and more preferably between about 15 atomic percent and about 20 atomic percent germanium. In an exemplary embodiment, the atomic percentage of germanium is adjusted by controlling the partial pressure of $SiH_4$ and $GeH_4$.

In alternative embodiments, SiGe regions 30 are formed by gradually adjusting the germanium atomic percentage with the proceeding of the epitaxial growth. Preferably, from the bottom portions of SiGe regions 30 to the top portions, the germanium atomic percentage is gradually increased. This can be achieved, for example, by gradually increasing the flow rate of $GeH_4$. In an exemplary embodiment, the bottom portions of SiGe regions 30 have a germanium atomic percentage of less than about 10 percent, while the germanium atomic percentage is increased to about 15 percent or greater in the top portions of SiGe regions 30.

Figure 7:
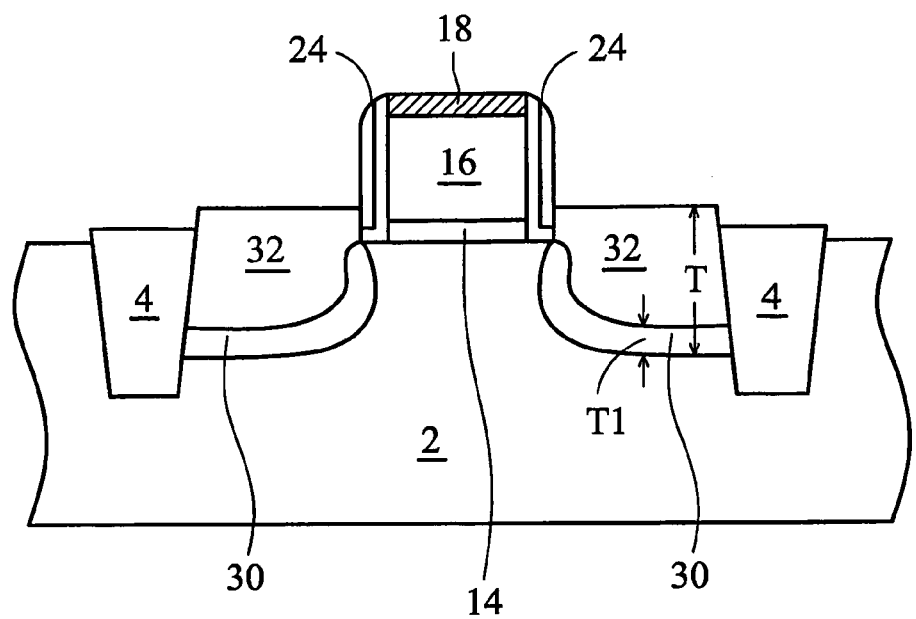

Referring to FIG. 7, SiGe regions 30 preferably only occupy bottom portions of the recesses 26. After the formation of SiGe regions 30, process conditions for epitaxial growth are changed to form SiGe regions 32 on SiGe regions 30, wherein SiGe regions 32 have a higher germanium atomic percentage than SiGe regions 30. Preferably, the formation of SiGe regions 32 is performed in-situ with the formation of SiGe regions 30. In an exemplary formation process, the partial pressure of $GeH_4$ is increased by increasing its flow rate. The resulting SiGe regions 32 have a preferred germanium concentration of between about 25 atomic percent and about 50 atomic percent, and more preferably between about 25 atomic percent and about 35 atomic percent. The germanium atomic percentage in SiGe regions 32 is also preferably higher than the atomic percentage in SiGe region 30 with a difference of greater than about five atomic percent.

Figure 8:
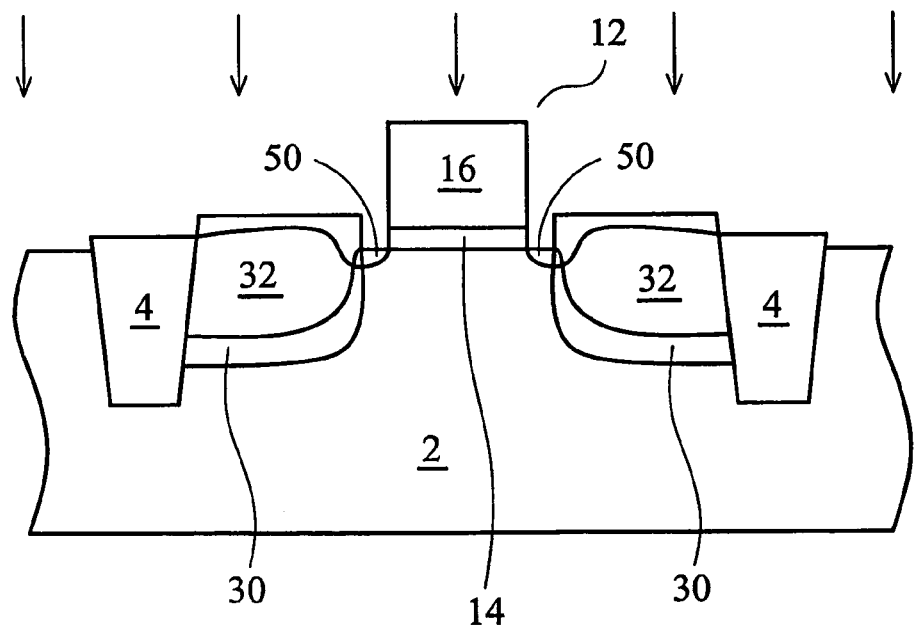

Referring to FIG. 8, dummy spacers 24 and hard mask 18 are removed. In an exemplary embodiment, the silicon nitride portions of dummy spacers 24 and hard mask 18 are removed by etching in phosphoric acid, and the liner oxide portions of dummy spacers 24 are stripped using diluted hydrofluoric acid.

Lightly doped source/drain (LDD) regions 50 are then formed, preferably by implanting a p-type impurity. Gate stack 12 acts as a mask so that LDD regions 50 are substantially aligned with the respective edge of gate stack 12. Halo/pocket regions (not shown) are also formed, preferably by implanting n-type impurities.

Figure 9:
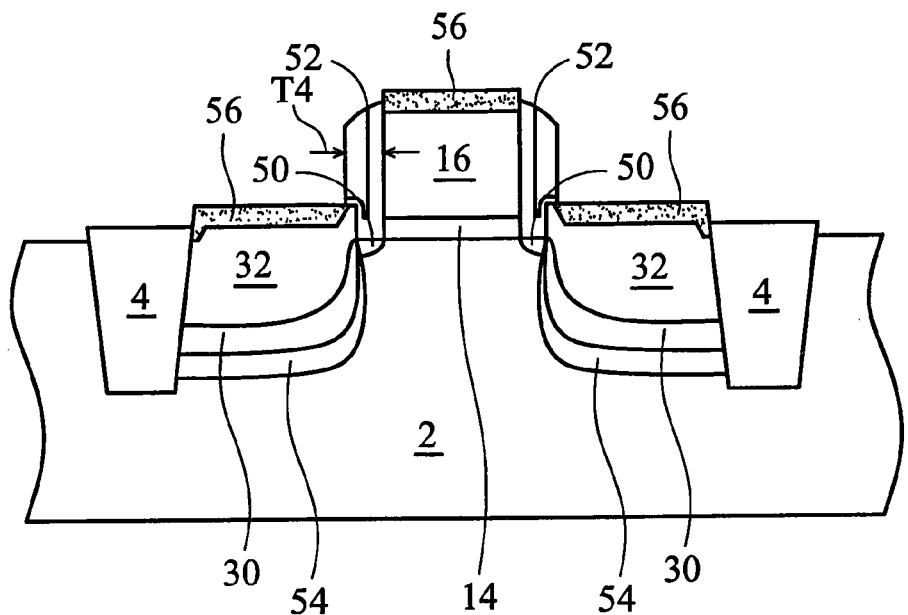

In FIG. 9, spacers 52 are formed. Preferably, a liner oxide layer and a nitride layer are blanket formed. The liner oxide layer and the nitride layer are then patterned to form spacers 52. In the preferred embodiment, spacers 52 have a thickness T4 greater than a thickness T3 of dummy spacers 24 (refer to FIG. 4), although thickness T4 may be equal to or smaller than thickness T3.

Deep source/drain regions 54 are then formed, preferably by implanting p-type impurities such boron, indium, and the like. FIG. 9 also illustrates the formation of silicide regions 56. As is known in the art, silicide regions 56 can be formed by depositing a thin layer of metal, such as titanium, cobalt, nickel, tungsten, or the like, over the devices, including the exposed surfaces of SiGe stressors 32 and gate electrode 16. The substrate is then heated, causing a silicide reaction to occur wherever the metal is in contact with silicon. After the reaction, a layer of metal silicide is formed between the silicon and metal. The un-reacted metal is then selectively removed.

Figure 10:
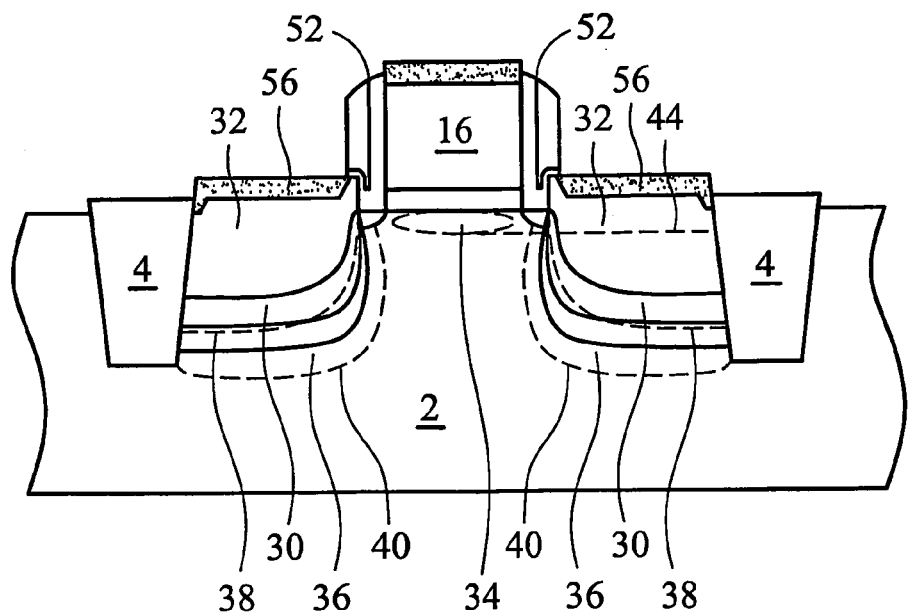
FIG. 10 illustrates preferred locations of the stressors with respect to a channel region and depletion regions of the PMOS device.

FIG. 10 schematically illustrates channel region 34 of a MOS device and depletion regions 36 in proximity to junctions. FIG. 10 is also used for the further discussion of SiGe regions 30 and 32. To achieve optimum effects, SiGe regions 30 preferably have a thickness Ti of less than about one-third the combined thickness T of SiGe regions 30 and 32 (refer to FIG. 7). FIG. 10 also illustrates the relative locations of SiGe regions 30 and 32 with respect to depletion regions of the source/drain junctions. Depletion regions 36 are regions defined between dotted lines 38 and 40. In the preferred embodiment, the interfaces of SiGe regions 30 and 32 are higher than the depletion regions 36. Generally, at an interface of two layers having different lattice constants, for example, a Si layer and a SiGe layer, defects and dislocations are generated. The number of defects and dislocations increases with the increase in lattice mismatch. If the highly defective regions, which are the surrounding regions of the interfaces between Si and SiGe, fall into the depletion regions, the leakage current between the source/drain regions and the substrate will likely be high. By forming SiGe regions 30 having a low germanium concentration, the highly defective regions are raised above the depletion regions 36. The number of defects that fall within the depletion regions is decreased accordingly, resulting in a significant decrease in leakage currents.

SiGe regions 32 preferably extend below a bottom level 44 of the channel region 34. Since the stress applied by the SiGe stressors is related to the atomic percentage of germanium in the stressors, it is preferred that on both sides of the channel region, the SiGe stressors have a high germanium concentration. By maintaining the bottoms of SiGe regions 32 below channel region 34, the stress applied to the channel region 34 is less adversely affected by the introduction of the low-germanium SiGe regions 30.

The previously discussed embodiment illustrates the formation of SiGe stressors by using dummy spacers. Alternatively, SiGe stressors can be formed without forming dummy spacers. In an exemplary embodiment, the formation process includes forming a gate stack, forming LDD regions and halo/pocket regions, forming gate spacers, recessing the substrate to form recesses, growing composite SiGe stressors in the recesses, wherein the composite SiGe stressors comprise a high-germanium layer on a low-germanium layer, doping deep source/drain regions, and forming silicide regions on the deep source/drain regions and the gate electrode.

Figure 11:
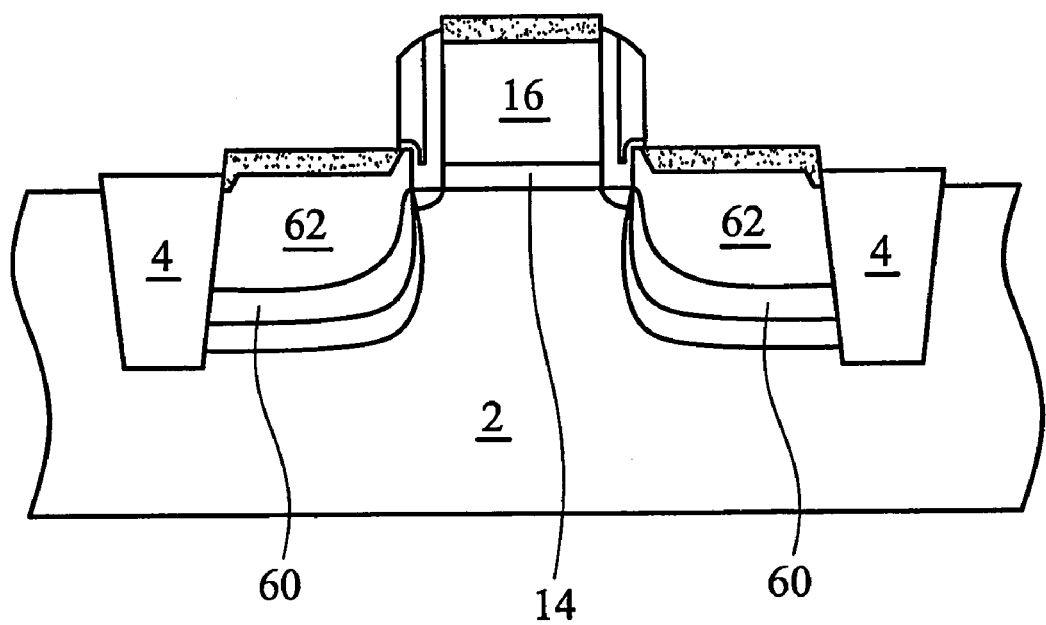
FIG. 11 illustrates a cross-sectional view of an NMOS embodiment.

The concept of the preferred embodiments of the present invention may also be used with the formation of NMOS devices. FIG. 11 illustrates an NMOS device, which includes stressors 60 and 62 having lower lattice constants than the lattice constant of substrate 2. In the preferred embodiment, stressors 60 and 62 comprise SiC regions, and SiC regions 60 have a lower carbon atomic percentage than that of SiC regions 62. The preferred dimensions of SiC stressors 60 and 62 are essentially the same as those of SiGe stressors discussed previously. For example, the carbon atomic percentage in SiC regions 60 is preferably between about one atomic percent and about five atomic percent. The carbon atomic percentage in SiC region 62 is preferably between about five atomic percent and about ten atomic percent.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Aspects of the invention include:

1. A method for forming a semiconductor device comprising:
   providing a semiconductor substrate;
   forming a gate stack on the semiconductor substrate;
   forming a gate spacer on a sidewall of the gate stack;
   forming a recess in the semiconductor substrate adjacent the gate spacer; and
   forming a stressor having at least a portion in the recess, wherein the stressor comprises an element having a lattice constant different from a lattice constant of the semiconductor substrate, and wherein the step of forming the stressor comprises:
   forming a lower portion in the recess, wherein the element in the lower portion has a first atomic percentage; and
   forming a higher portion on the lower portion, wherein the element in the higher portion has a second atomic percentage substantially greater than the first atomic percentage.

2. The method of claim 1, wherein the step of forming the stressor comprises epitaxial growth.

3. The method of claim 1, wherein the step of forming the higher portion comprises gradually changing a flow rate of a precursor comprising the element.

4. The method of claim 1, wherein the first atomic percentage is between about 10 percent and about 25 percent, and wherein the second atomic percentage is between about 25 percent and about 50 percent.

5. The method of claim 1, wherein the element comprises germanium, and wherein the method further comprises doping a p-type impurity into a source/drain region of the semiconductor device.

6. The method of claim 1, wherein the element comprises carbon, and wherein the method further comprises doping an n-type impurity into a source/drain region of the semiconductor device.

7. A method for forming a semiconductor device comprising:
   providing a semiconductor substrate;
   forming a gate stack on the semiconductor substrate;
   forming a dummy spacer on a sidewall of the gate stack;
   forming a recess in the semiconductor substrate substantially aligned with an outer edge of the dummy spacer;
   forming a stressor having at least a portion in the recess, wherein the stressor comprises an element selected from the group consisting essentially of germanium and carbon, and wherein the step of forming the stressor comprises:
forming a lower portion in the recess, wherein the element in the lower portion has a first atomic percentage; and
forming a higher portion on the lower portion, wherein the element in the higher portion has a second atomic percentage substantially greater than the first atomic percentage;
removing the dummy spacer;
forming a gate spacer on the sidewall of the gate stack; and
doping an impurity to form a deep source/drain region.

8. The method of claim 7, wherein the step of forming the stressor comprises epitaxial growth.

9. The method of claim 7 further comprising forming a lightly doped source/drain region after the step of removing the dummy spacer and before the step of forming the gate spacer.

10. The method of claim 9, wherein the gate spacer has a thickness greater than a thickness of the dummy spacer.

11. The method of claim 7, wherein the first atomic percentage is between about 10 percent and about 25 percent, and wherein the second atomic percentage is between about 25 percent and about 50 percent.

12. The method of claim 7, wherein the element comprises germanium, and wherein the impurity is of p-type.

13. The method of claim 7, wherein the element comprises carbon, and wherein the impurity is of n-type.

What is claimed is:

1. A semiconductor device comprising:
a semiconductor substrate;
a gate stack on the semiconductor substrate; and
a stressor adjacent the gate stack and having at least a portion in the semiconductor substrate, wherein the stressor comprises an element selected from the group consisting essentially of germanium and carbon and having a lattice constant different from a lattice constant of the semiconductor substrate, and wherein the stressor comprises:
  a lower portion comprising the element, wherein the element in the lower portion has a first atomic percentage; and
  a higher portion on the lower portion, wherein the element in the higher portion has a second atomic percentage substantially greater than the first atomic percentage, wherein an interface between the lower portion and the higher portion of the stressor comprises a first portion and a second portion, and wherein the first portion is between a bottom of the higher portion and a top of the lower portion of the stressor, and the second portion is between sidewalls of the higher and the lower portions of the stressor.

2. The semiconductor device of claim 1, wherein the first atomic percentage is between about 10 percent and about 25 percent.

3. The semiconductor device of claim 1, wherein the second atomic percentage is between about 25 percent and about 50 percent.

4. The semiconductor device of claim 1, wherein the second atomic percentage and the first atomic percentage have a difference of greater than about five percent.

5. The semiconductor device of claim 1, wherein the higher portion extends below a bottom level of a channel region of the semiconductor device.

6. The semiconductor device of claim 1, wherein an interface between the lower portion and the higher portion is substantially outside a depletion region of a respective source/drain junction.

7. The semiconductor device of claim 1, wherein the lower portion has a thickness less than about one-third a thickness of the stressor.

8. The semiconductor device of claim 1, wherein the element comprises germanium and the semiconductor device comprises a PMOS device.

9. The semiconductor device of claim 1, wherein the element comprises carbon and the semiconductor device comprises an NMOS device.

10. The semiconductor device of claim 1, wherein concentrations of the element in the lower portion increase from portions close to the semiconductor substrate to portions close to the higher portion of the stressor.

11. A semiconductor device comprising:
a semiconductor substrate comprising silicon;
a gate stack on the semiconductor substrate;
a stressor region adjacent the gate stack and having at least a portion in the semiconductor substrate, wherein the stressor region comprises silicon and an element selected from the group consisting essentially of germanium and carbon, and wherein the element in the stressor has a first atomic percentage;
an intermediate region between the semiconductor substrate and the stressor region, wherein the intermediate region comprises silicon and the element, and wherein the element in the intermediate region has a second atomic percentage lower than the first atomic percentage, and greater than a third atomic percentage of the element in the semiconductor substrate; and
an interface between the stressor region and the intermediate region comprises a first portion and a second portion, wherein the first portion is between a bottom of the stressor region and a top of the intermediate region, and the second portion is between sidewalls of the stressor region and the intermediate region.

12. The semiconductor device of claim 11 further comprising a silicide region over and contacting the stressor region.

13. The semiconductor device of claim 11, wherein the first atomic percentage is between about 25 percent and about 50 percent and the second atomic percentage is between about 10 percent and about 25 percent.

14. The semiconductor device of claim 11, wherein the second atomic percentage and the first atomic percentage have a difference of greater than about five atomic percent.

15. The semiconductor device of claim 11, wherein the stressor region extends below a bottom level of a channel region of the semiconductor device.

16. The semiconductor device of claim 11, wherein an interface between the intermediate region and the stressor region is outside a depletion region of a respective source/drain junction.

17. The semiconductor device of claim 11, wherein the intermediate region has a thickness of less than about one-third a combined thickness of the stressor region and the intermediate region.

18. The semiconductor device of claim 11, wherein the element comprises germanium and the semiconductor device comprises a PMOS device.

19. The semiconductor device of claim 11, wherein the element comprises carbon and the semiconductor device comprises an NMOS device.

20. The semiconductor device of claim 1 further comprising a silicide region on the higher portion of the stressor.

* * * * *